(12) United States Patent
Lin et al.

(10) Patent No.: US 8,900,895 B2
(45) Date of Patent: Dec. 2, 2014

(54) METHOD FOR MANUFACTURING LED PACKAGE

(71) Applicant: Advanced Optoelectronic Technology, Inc., Hsinchu Hsien (TW)

(72) Inventors: Hou-Te Lin, Hsinchu (TW); Ming-Ta Tsai, Hsinchu (TW)

(73) Assignee: Advanced Optoelectronic Technology, Inc., Hsinchu Hsien (JP)

( * ) Notice: Subject to any disclaimer, the term of this patent is extended or adjusted under 35 U.S.C. 154(b) by 0 days.

(21) Appl. No.: 14/014,403

(22) Filed: Aug. 30, 2013

(65) Prior Publication Data
US 2014/0004633 A1    Jan. 2, 2014

Related U.S. Application Data

(62) Division of application No. 13/326,340, filed on Dec. 15, 2011, now Pat. No. 8,552,462.

(30) Foreign Application Priority Data

Apr. 2, 2011    (CN) .......................... 2011 1 0831482

(51) Int. Cl.
| | |
|---|---|
| H01L 21/00 | (2006.01) |
| H01L 33/62 | (2010.01) |
| H01L 33/38 | (2010.01) |
| H01L 33/48 | (2010.01) |
| H01L 33/64 | (2010.01) |

(52) U.S. Cl.
CPC ................ *H01L 33/38* (2013.01); *H01L 33/62* (2013.01); *H01L 33/647* (2013.01); *H01L 2224/16* (2013.01); *H01L 33/486* (2013.01)
USPC .................... 438/26; 438/22; 257/98; 257/99; 257/82; 257/276; 257/457; 257/459; 257/502; 257/573; 257/584; 257/621

(58) Field of Classification Search
USPC ............ 257/98, 41, 81, 82, 91, 99, 177–182, 257/276, 457, 459, 502, 503, 573, 584, 602, 257/621, 664–677, 688–700, 734–786, 88; 438/22, 26
See application file for complete search history.

(56) References Cited

U.S. PATENT DOCUMENTS

| | | | |
|---|---|---|---|
| 7,514,718 B2 | 4/2009 | Shin et al. | |
| 2002/0167093 A1* | 11/2002 | Koike | ........................ 257/778 |
| 2009/0239319 A1* | 9/2009 | Wang et al. | .................... 438/27 |

FOREIGN PATENT DOCUMENTS

| | | |
|---|---|---|
| CN | 101026207 A | 8/2007 |
| CN | 101338865 A | 1/2009 |
| JP | 2006-344978 A | 12/2006 |

*Primary Examiner* — Kyoung Lee
*Assistant Examiner* — Ratisha Mehta
(74) *Attorney, Agent, or Firm* — Novak Druce Connolly Bove + Quigg LLP

(57) ABSTRACT

A method of manufacturing an LED package including steps: providing an electrode, the electrode including a first electrode, a second electrode, a channel defined between the first electrode and the second electrode, the first electrode and the second electrode arranged with intervals mutually, a cavity arranged on the first electrode, and the cavity communicating with the channel; arranging an LED chip electrically connecting with the first electrode and the second electrode and arranged inside the cavity; providing a shield covering the first electrode and the second electrode; injecting a transparent insulating material to the cavity via the channel, and the first electrode, the second electrode, and the shield being interconnected by the transparent insulating material; solidifying the transparent insulating material to obtain the LED package.

8 Claims, 8 Drawing Sheets

METHOD FOR MANUFACTURING LED PACKAGE

CROSS-REFERENCE TO RELATED APPLICATIONS

This patent application is a divisional application of patent application Ser. No. 13/326,340, filed on Dec. 15, 2011, entitled "LED PACKAGE AND METHOD FOR MANUFACTURING THE SAME," which is assigned to the same assignee as the present application, and which is based on and claims priority from Chinese Patent Application No. 201110083148.2 filed in China on Apr. 2, 2011. The disclosures of patent application Ser. No. 13/326,340 and the Chinese Patent Application are incorporated herein by reference in their entirety.

BACKGROUND

1. Technical Field

The disclosure relates to a method for manufacturing light emitting diode (LED) package, wherein the LED package has a good heat dissipation and a high luminous efficacy.

2. Description of the Related Art

The many advantages of light emitting diodes (LEDs), such as high luminosity, low operational voltage, low power consumption, compatibility with integrated circuits, easy driving, long term reliability, and environmental friendliness have promoted their wide use as a light source. Now, light emitting diodes are commonly applied in environmental lighting. However, an encapsulation layer must be formed on the substrate during the manufacture of a common LED package structure. The common LED package structure does not have good thermal dissipation efficiency. Thus, the reliability and luminous efficacy of the common LED package will decrease.

Therefore, it is desirable to provide a method for manufacturing LED package which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED package. Moreover, in the drawings, like reference numerals designate corresponding parts throughout the views.

DETAILED DESCRIPTION

Embodiments of an LED package and a method for manufacturing the LED package as disclosed are described in detail here with reference to the drawings.

Figure 1:
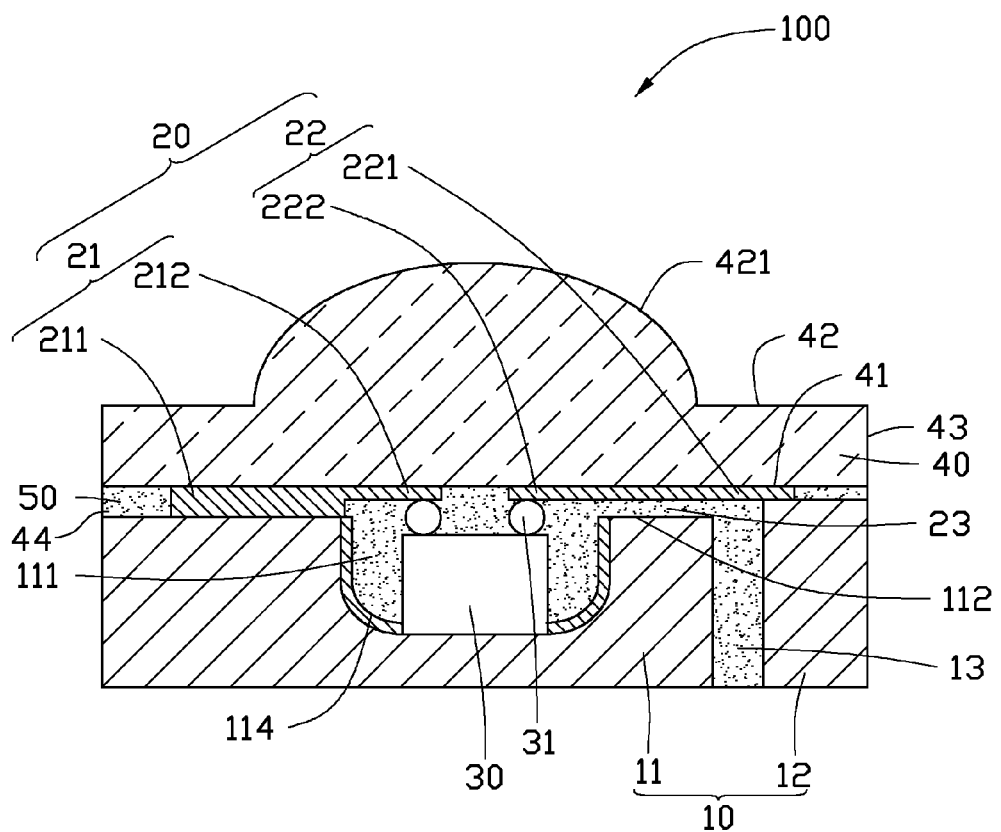
FIG. 1 is a cross sectional view of an LED package in accordance with a first embodiment.
Figure 2:
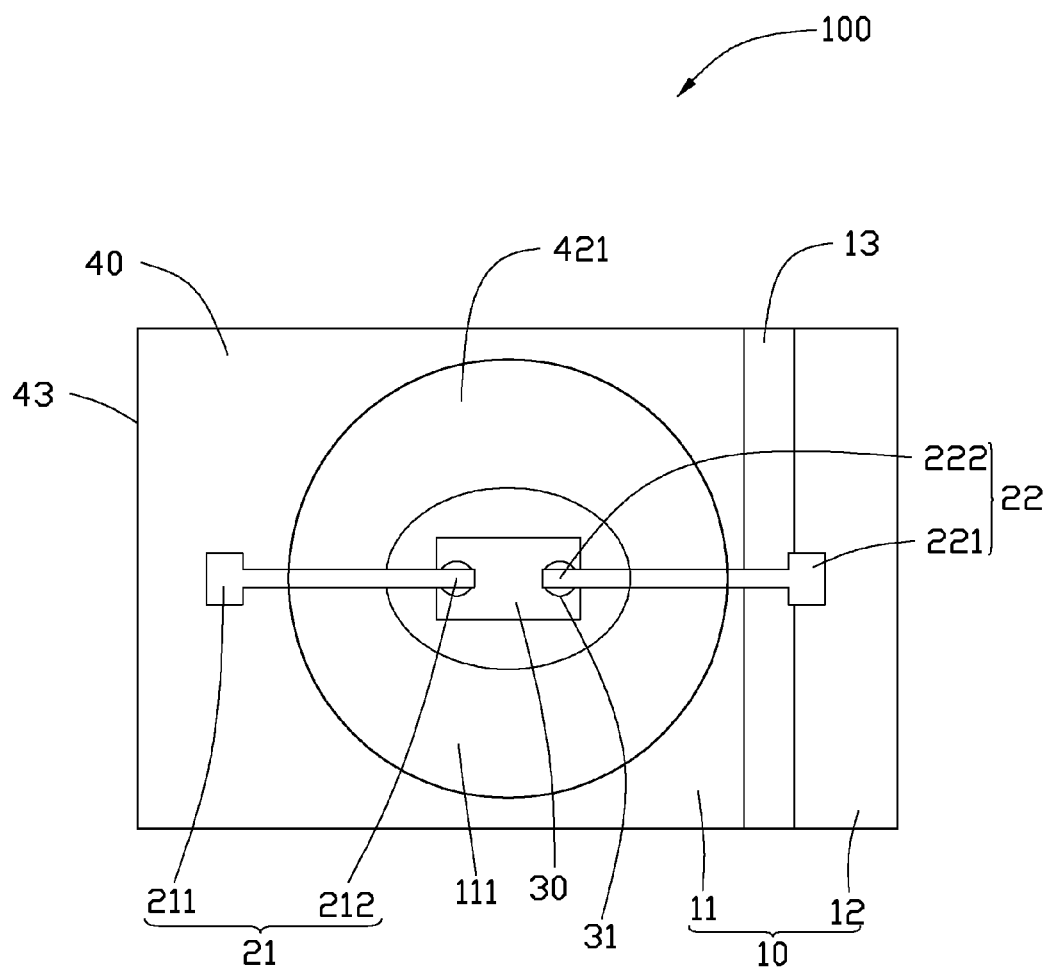
FIG. 2 is a top view of the LED package of FIG. 1.

Referring to FIGS. 1 and 2, an LED package structure 100 includes an electrode 10, a connection electrode 20, an LED chip 30, a lens 40, and an insulation layer 50.

The electrode 10 includes a first electrode 11 and a second electrode 12. The first electrode 11 and the second electrode 12 are arranged with intervals mutually. A channel 13 is formed between the first electrode 11 and the second electrode 12. The first electrode 11 and the second electrode 12 are rectangular. The mass of the first electrode 11 exceeds that of the second electrode 12. The first electrode 11 has a top surface 112, and a cavity 111 is defined on the top surface 112. The LED chip 30 is arranged inside the cavity 111. Thus, the LED chip 30 is attached to the bottom surface of the cavity 111. The bottom surface of the cavity 111 is a dished or curved surface. In this embodiment, the bottom surface of the cavity 111 is dished. The depth of the cavity 111 exceeds the thickness of the LED chip 30. Thus, the LED chip 30 is totally within the cavity 111. A reflection layer 114 is formed on the inside surface of the cavity 111. The material of the electrode 10 is copper, and the material of the reflection layer 114 is silver.

The connection electrode 20 includes a first connection electrode 21 and a second connection electrode 22. The first connection electrode 21 is a strip of electrically conductive material. The first connection electrode 21 includes a fixture end 211 and a free end 212. The fixture end 211 connects with the top surface 112 of the first electrode 11. The free end 212 extends to the top of the cavity 111. The second connection electrode 22 is also a strip of electrically conductive material. The second connection electrode 22 includes a fixture end 221 and a free end 222. The fixture end 221 connects to the top surface of the second electrode 12. The free end 222 extends to the top of the cavity 111. A certain distance exists between the free end 212 of the first connection electrode 21 and the free end 222 of the second connection electrode 22. The top surfaces of the first connection electrode 21 and the second connection electrode 22 are at the same horizontal level. A gap 23 is between the top surface 112 of the first electrode 11 and the second connection electrode 22. The gap 23 communicates with the channel 13 and the cavity 111. The material of the connection electrode 20 is the same as that of the electrode 10.

In another embodiment, the first electrode 11 and the first connection electrode 21 are formed in one piece. Furthermore, the second electrode 12 and the second connection electrode 22 may be formed in one piece.

The LED chip 30 is arranged in the cavity 111 of the first electrode 11. The LED chip 30 is attached at the bottom of the cavity 111. The LED chip 30 has two electrodes (not shown). A welding spot 31 is arranged on each of the two electrodes. The welding spots 31 connect to the free ends 212 of the first connection electrode 21 and the free end 222 of the second connection electrode 22. Thus, the LED chip 30 connects electrically to the first electrode 11 and to the second electrode 12.

The lens 40 is transparent. The lens 40 includes a light incident surface 41 near the LED lens 40, a light emitting surface 42 away the LED chip 30, and a side surface 43 connecting to the light incident surface 41 and the light emitting surface 42. The light incident surface 41 is flat. The light incident surface 41 is attached to the first connection electrode 21 and the second connection electrode 22.

A space 44 exists between the light incident surface 41 and the top surface 112 of the first electrode 11. The first light emitting surface 42 has at least one protrusion portion 421. The protrusion portion 421 extends in a direction away the LED chip 30. In another embodiment, the quantity and shape of the protrusion portion 421 can be changed according to specific needs. The side surface 43 is coplanar with the side surface defined by the first electrode 11 and the second electrode 12. Thus, the lens 40 totally covers the first electrode 11 and the second electrode 12. The lens 40 is made of silicon resin, epoxy resin, and silicon oxide.

The insulation layer 50 fills the channel 13 between the lens 40, the first electrode 11, and the second electrode 12. Furthermore, the insulation layer 50 also totally fills the surround of the LED chip 30 in the cavity 111 and the space 44 between the lens 40 and the electrode 10. The insulation layer 50 is made by the injection method. Moreover, a plurality of fluorescent powders is uniformly added to the insulation layer 50. Thus, the light emitting characteristics of the LED package structure 100 are enhanced.

Figure 3:
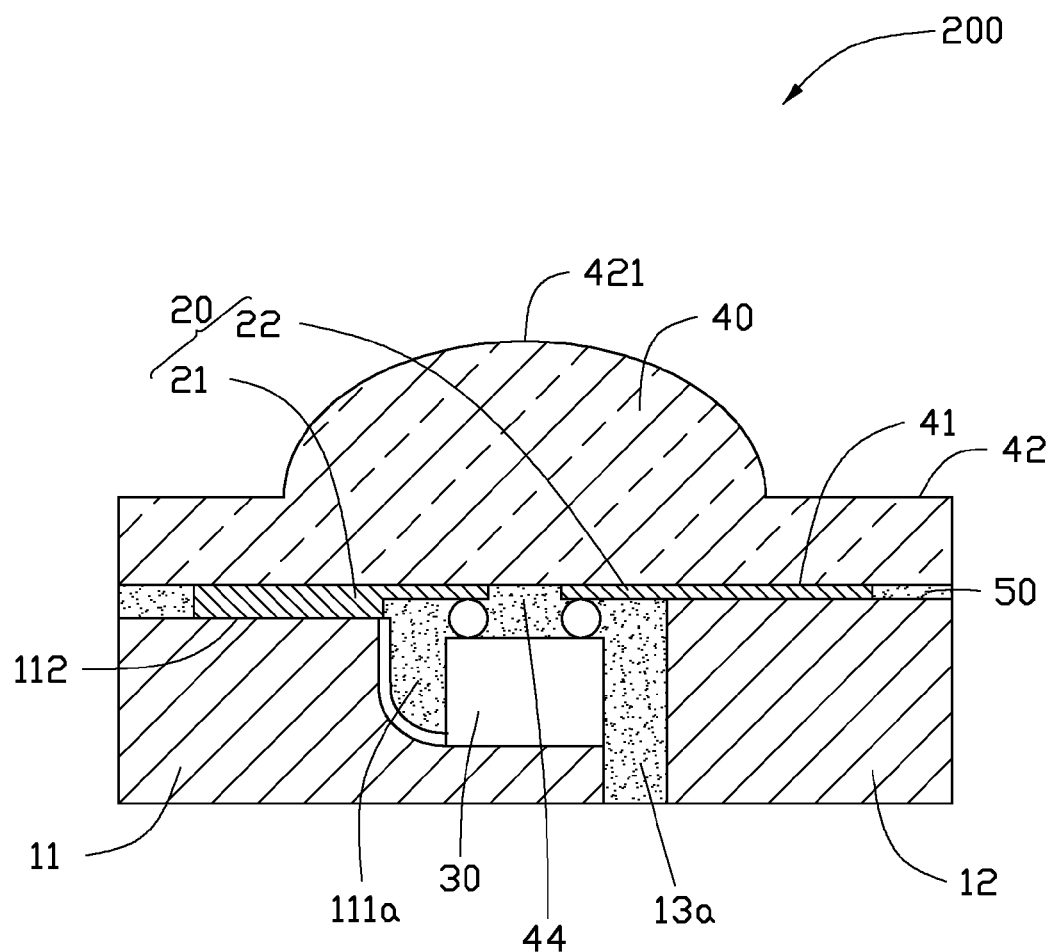
FIG. 3 is a cross sectional view of an LED package in accordance with a second embodiment.
Figure 8:
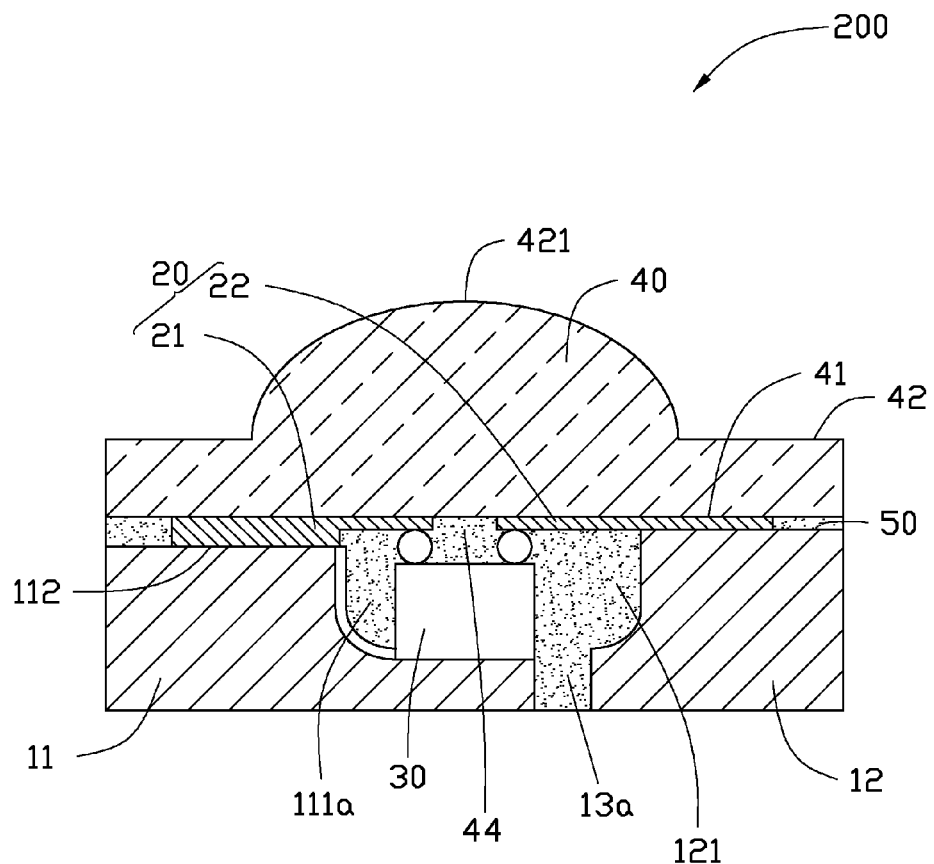
FIG. 8 is a cross sectional view of an LED package in accordance with a fourth embodiment.

FIG. 3 shows an LED package structure 200 of a second embodiment. The only difference from the first embodiment is that a cavity 111a defined at the top surface 112 of the first electrode 11 has an opening facing the second electrode 12. The cavity 111a communicates with to the channel 13a via the opening of the cavity 111a. In another embodiment, another cavity 121 (as shown in FIG. 8) is defined at the second electrode 12. The opening of the other cavity 121 of the second electrode 12 faces the first electrode 11.

Figure 4:
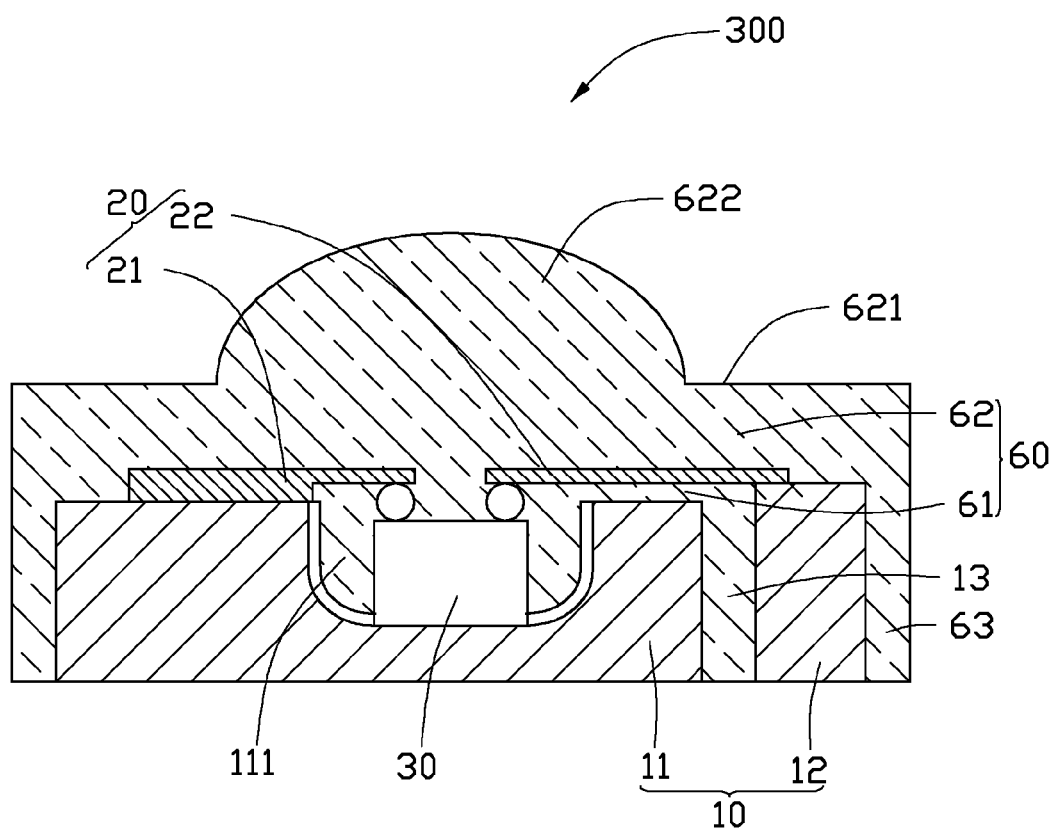
FIG. 4 is a cross sectional view of an LED package in accordance with a third embodiment.
Figure 5:
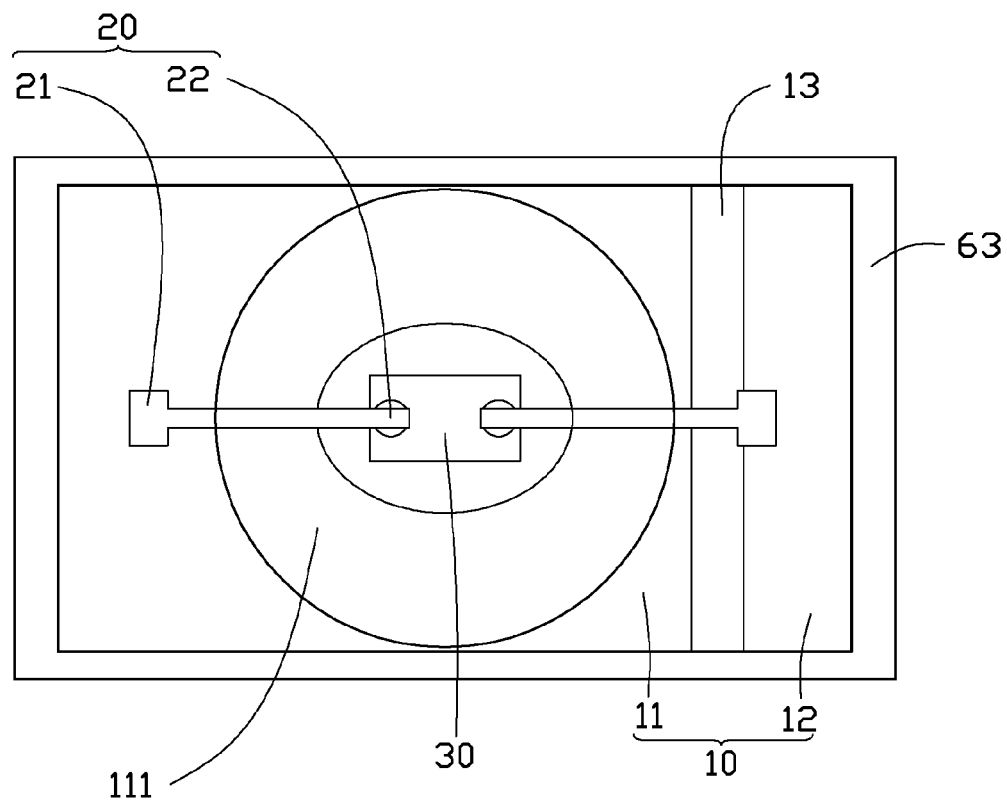
FIG. 5 is a top view of the LED package of FIG. 4.

Referring to FIGS. 4 and 5, an LED package 300 of a third embodiment includes an electrode 10, a connection electrode 20, an LED chip 30, and an encapsulating layer 60.

The electrode 10, the connection electrode 20, and the LED chip 30 in the third embodiment are the same as in the first embodiment. The only differences from the first embodiment is that the encapsulating layer 60 includes an insulation layer 61 which fills the surrounding of the LED chip 30 and covers the connection electrode 20, and a lens 62 on the insulation layer 61.

The insulation layer 61 and the lens 62 are formed in one piece. The insulation layer 61 fills the channel 13 defined by the first electrode 11 and the second electrode 12. The lens 62 includes a light emitting surface 621 away the LED chip 30. A protrusion portion 622 is formed on the light emitting surface 621 of the lens 62. The insulation layer 61 connects around the edge of the light emitting surface 621. A cover 63 extends from the edge of the light emitting surface 621 towards the electrode 10. The cover 63 encapsulating the side wall of the electrode 10 has a bottom which is coplanar with the bottom of the electrode 10 away the LED chip 30.

The encapsulating layer 60 maintains a firm connection with the electrode 10 because of the formation of the cover 63.

Figure 6:
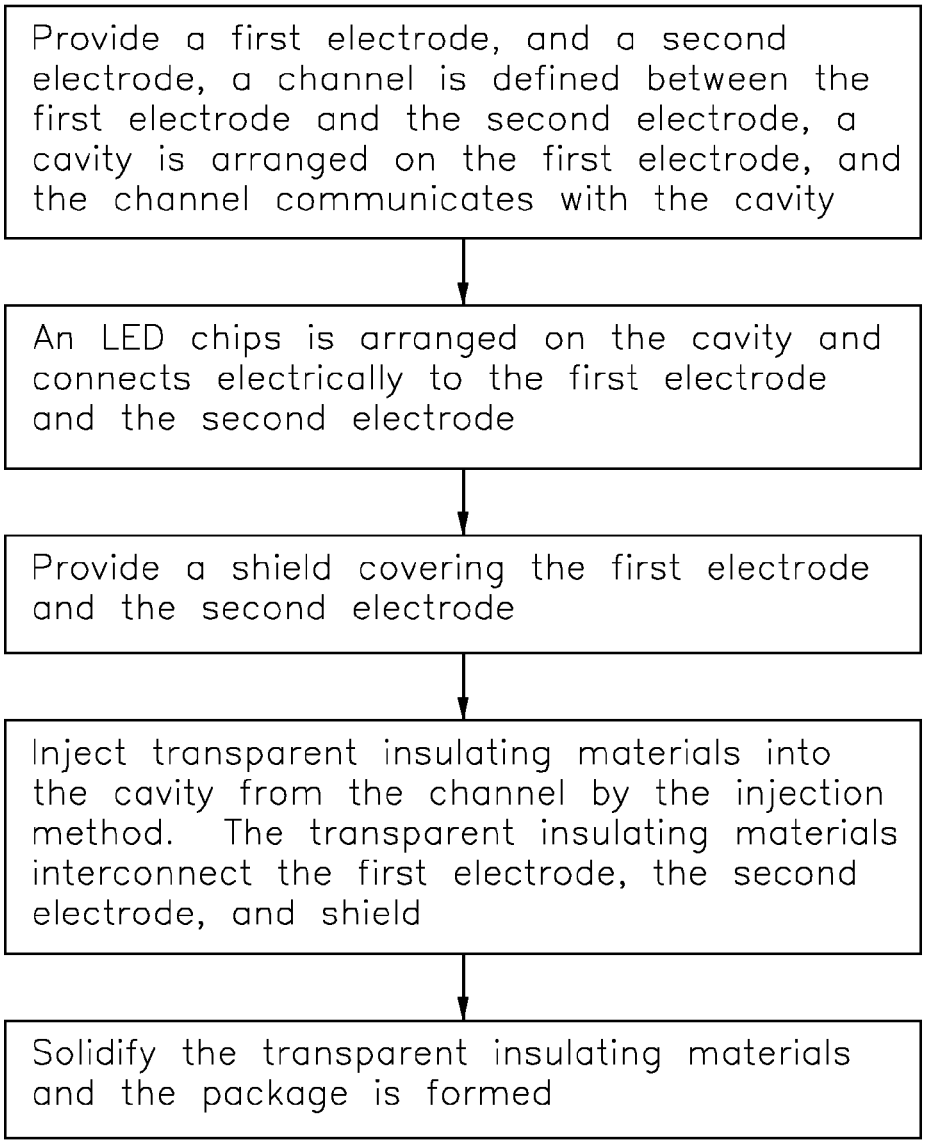
FIG. 6 is a process flow for manufacturing the LED package of FIGS. 1-2.

FIG. 6 shows the process flow of the LED package 100 in the first embodiment. The electrode 10 including the first electrode 11, and the second electrode 13, the channel 13 defined by the first electrode 11 and the second electrode 12 are to be provided. A cavity 111 is defined on the first electrode 11. The cavity 111 communicates with the cavity 13.

The LED chip 30 is arranged inside the cavity 111. The LED chip 30 connects electrically to the first electrode 11 and the second electrode 12.

A shield covering the first electrode 11 and the second electrode 12 is to be provided.

Inject a transparent insulating material(s) into the cavity 111 from the channel 13 by the injection method. The transparent insulating materials totally interconnect the first electrode 11, the second electrode 12, and the shield.

When transparent insulating material(s) solidify, the package is formed.

The shield can be the lens 40 in the first embodiment. The LED chip 30 connects with the electrode 10 by means of the connection electrode 20. The connection electrode 20 includes the first connection electrode 21 and the second connection electrode 22. The connection electrode 20 is pre-coated on the light incident surface 41 of the lens 40. Then, the electrode 10 is attached on the lens 40, and the LED chip 30 connects to the first connection electrode 21 and to the second connection electrode 22 by means of die bonding.

In another embodiment, the connection electrode 20 and the electrode 10 are formed in one piece out of one piece of electrically conductive material. The LED chip 30 is connected to the connection electrode 20 by die bonding. Then, the lens 40 is attached on the electrode 10.

During the injection method, the transparent insulating material is injected into the channel 13 defined between the first electrode 11 and the second electrode 12 until the transparent insulating material totally fills the cavity 111 and the space 44 between the lens 40 and the electrode 10. The insulation layer 50 is formed when the transparent insulating material solidifies. An amount of fluorescent powder(s) is added into the transparent insulating material before the injection process. Thus, the fluorescent powders will be uniformly mixed into the insulation layer 50 on solidification.

Figure 7:
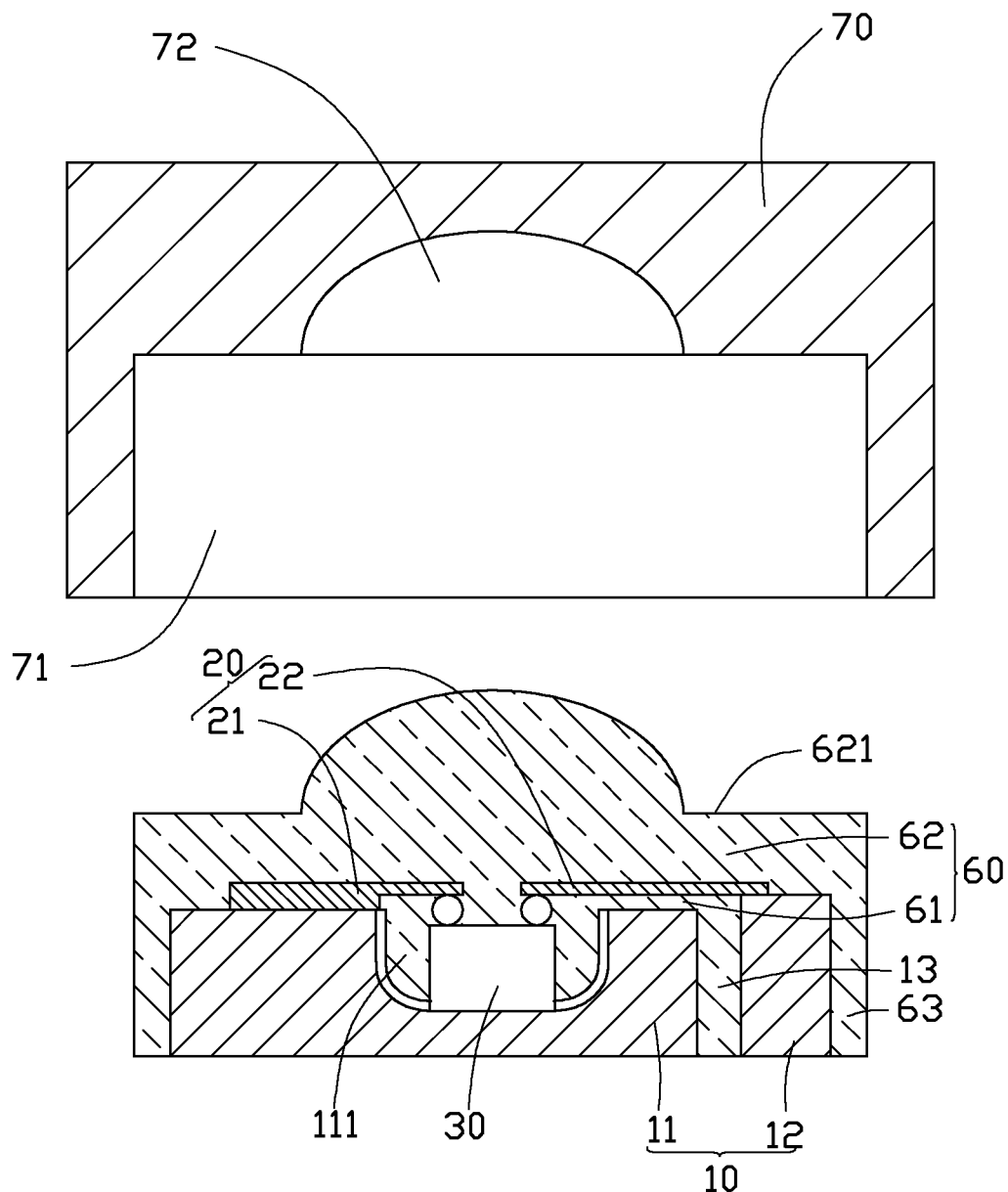
FIG. 7 is a cross sectional view of the LED package in accordance with the third embodiment and a mold for manufacturing the LED package.

Referring to FIG. 7, the shield can be a mold 70. The mold 70 includes a receiving cavity 71 and a concave portion 72. The size of the receiving cavity 71 exceeds the encircling size of the first electrode 11 and the second electrode 12. Thus, the first electrode 11 and the second electrode 12 are fixed within the receiving cavity 71. Then, during the injection method, the transparent insulating material is injected into the channel 13 defined between the first electrode 11 and the second electrode 12 until the mold 71 is totally filled. The transparent insulating material in the concave portion 72 forms the protrusion portion 622 of the lens 62 of FIG. 4.

Thus, the transparent insulating material in the mold 70 becomes the encapsulating layer 60 in the third embodiment.

The transparent material may be directly injected into the channel 13 defined between the first electrode 11 and the second electrode 12. Thus, the packaged structure is completed. The packaging method is simple. The LED chip 30 is arranged inside the cavity 111. The first electrode is a substrate carrying the LED chip 30. The electrode 10 being made of metal results in good electrical and thermal conductivity by the first electrode 11. Thus, any heat generated by the LED chip 30 can be efficiently dissipated via the first electrode 11. The thermal dissipation efficiency of the LED package structure and the brightness of the LED product are increased.

While the disclosure has been described by way of example and in terms of exemplary embodiments, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of manufacturing an LED package comprising steps:

providing an electrode, the electrode including a first electrode, a second electrode, a channel defined between the first electrode and the second electrode, the first electrode and the second electrode arranged to be distanced from each other, a cavity arranged on the first electrode, and the cavity communicating with the channel;

providing a connection electrode, the connection electrode comprising a first connection electrode and a second connection electrode, the first connection electrode and the second connection electrode being arranged on top surfaces of the first electrode and the second electrode, top surfaces of the first connection electrode and the second connection electrode being at a same horizontal level;

arranging an LED chip electrically connecting with the first electrode and the second electrode via the connection electrode and arranged inside the cavity;

providing a shield covering the first electrode and the second electrode;

injecting a transparent insulating material to the cavity via the channel, and the first electrode, the second electrode, and the shield being interconnected by the transparent insulating material; and solidifying the transparent insulating material to obtain the LED package.

2. The method of claim 1, wherein the shield is a lens, the lens covers the electrodes, the lens comprises a light emitting surface and a light incident surface, a protrusion portion is formed on the light emitting surface, a space is formed by the light emitting surface and the electrode, the insulating material is filled into the cavity through the channel until the space is filled totally.

3. The method of claim 1, wherein the shield is a mold, the mold comprises a receiving cavity and a concave portion, the first and second electrodes are arranged inside the receiving cavity, the transparent insulating material filling in the receiving cavity and the concave portion, the transparent insulating material filled in the concave portion forming a protrusion portion of a lens of the LED package.

4. The method of claim 1, wherein the first electrode has a top surface, the cavity is formed from the top surface of the first electrode.

5. The method of claim 4, wherein the cavity has an opening facing the second electrode and the second electrode has other cavity facing the first electrode, the transparent insulating material also filling in the other cavity.

6. The method of claim 1, wherein the first connection electrode being connected to the first electrode, the second connection electrode being connected to the second electrode, the first connection electrode comprising a fixture end and a free end, the fixture end being fixed on a top surface of the first electrode, the free end extending to a top of the cavity, the second connection electrode comprising a fixture end and a free end, the fixture end of the second connection electrode being fixed on the top surface of the second electrode, the free end of the second connection electrode extending to the top of the cavity, an interval being between the two free ends, and the LED chip electrically connecting the two free ends and the electrode.

7. The method of claim 6, wherein a gap is defined by the second connection electrode and the first electrode, and the channel communicates with the cavity by the gap, the insulation layer also filling in the gap.

8. The LED package of claim 1, wherein a reflection layer is formed on inside surfaces of the cavity.

* * * * *